United States Patent [19]

Herchen, Jr. et al.

[11] Patent Number: 5,426,597

[45] Date of Patent: Jun. 20, 1995

[54] ADAPTIVE INFINITE IMPULSE RESPONSE (IIR) FILTER SYSTEM

[75] Inventors: James R. Herchen, Jr., Exeter; Allen G. Lindgren, Sauderstown, both of R.I.

[73] Assignee: The United States of America as represented by the Secretary of the Navy, Washington, D.C.

[21] Appl. No.: 233,562

[22] Filed: Apr. 26, 1994

[51] Int. Cl.⁶ .............................................. G06F 15/31
[52] U.S. Cl. ............................ 364/724.19; 364/724.17
[58] Field of Search ............ 364/724.19, 724.2, 724.17, 364/724.01

[56] References Cited

U.S. PATENT DOCUMENTS

| | | | |
|---|---|---|---|
| 4,843,583 | 6/1989 | White et al. | 364/724.19 |
| 4,989,170 | 1/1991 | Batruni et al. | 364/724.19 |
| 5,058,047 | 10/1991 | Chung | 364/724.19 |
| 5,111,418 | 5/1992 | Kummert | 364/724.19 |
| 5,233,635 | 8/1993 | Henriksson et al. | 364/724.19 |

*Primary Examiner*—David H. Malzahn
*Attorney, Agent, or Firm*—Michael J. McGowan; Prithvi C. Lall; Michael F. Oglo

[57] ABSTRACT

An adaptive filter system for use in connection with a reference system that receives an input $u(s)$ and generating in response thereto a reference output $y(s)$ defined by a reference transfer function $H(s) = c(sI - A)^{-1}b + d$, where "I" is the identity matrix and matrix A, vectors b and c, and scalar d are reference parameters, and "s" is a variable for the input. The adaptive filter system comprises a system model module, a gradient filter module, an adjustable parameter module, and a parameter adjustment module. The system model module receives the input $u(s)$ and generates in response thereto and in response to a plurality of model parameters matrix $A'$, vectors $b'$ and $c'$, and scalar d, an intermediate model output vector $x'(s) = u(s)I - A'$ and a model output $y'(s) = cx'(s)b + d$. The gradient filter module receives the intermediate model output vector $x'(s)$ and generates a gradient output vector $w(s) = \int x'(s) + A'w(s)ds$. The adjustable parameter module receives the gradient output vector $w(s)$ from the gradient filter module, $x'(s)$ from the system model module and input $u(s)$ and generates dot products with respective adjustable parameters $\alpha$, $\beta$ and $\delta$ to generate a model adjustment value $v'(t)$. The parameter adjustment module generates adjusted parameters for use by the adjustable parameter module in response to current values of adjustable parameters and an error value $e(s) = y(s) - [y'(s) + v'(s)]$.

6 Claims, 4 Drawing Sheets

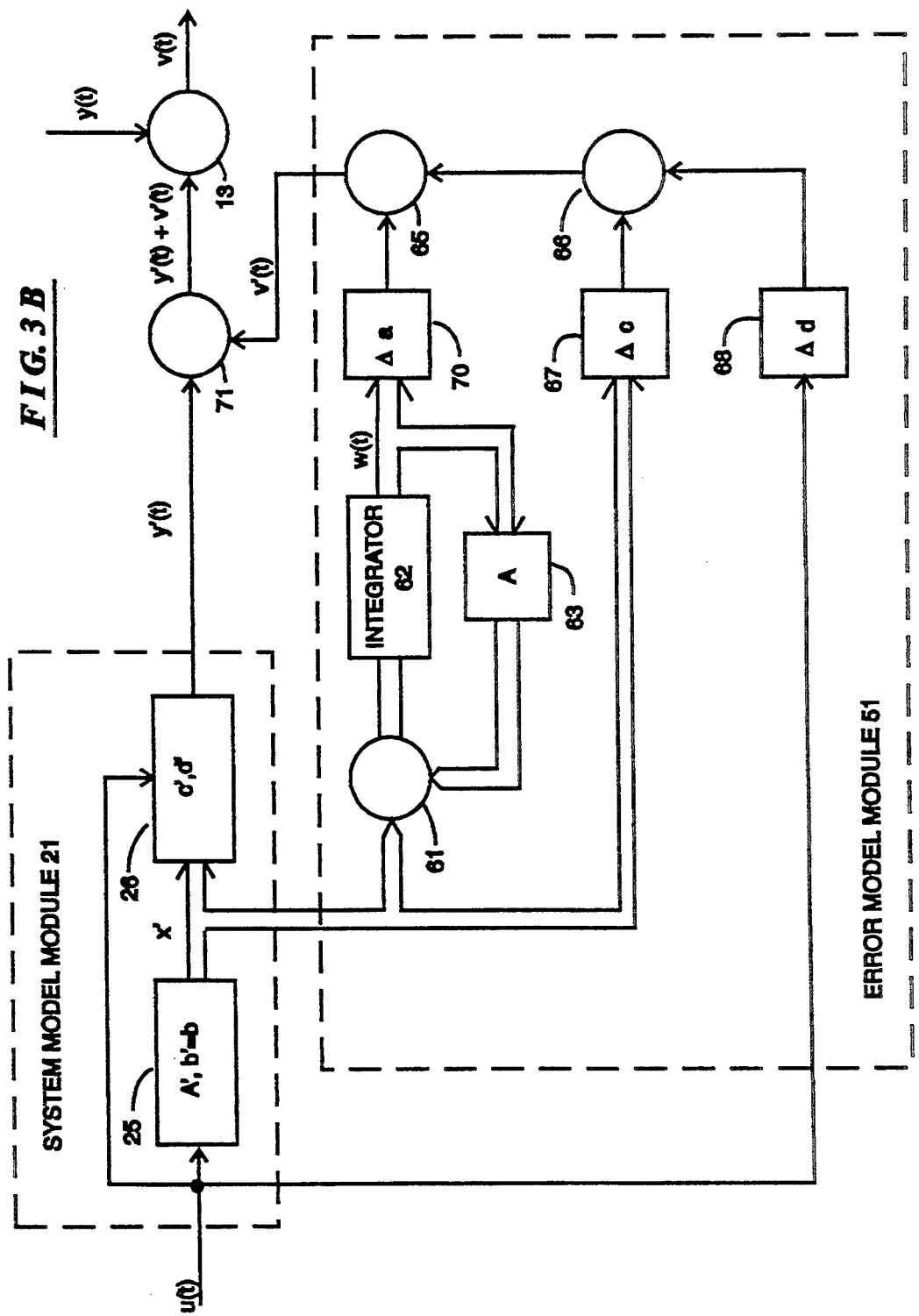

ADAPTIVE INFINITE IMPULSE RESPONSE (IIR) FILTER SYSTEM

STATEMENT OF GOVERNMENT INTEREST

The invention described herein may be manufactured by or for the Government of the United States of America for Governmental purposes without the payment of any royalties thereon or therefor.

BACKGROUND OF THE INVENTION (1) Field of the Invention

The invention relates generally to the field of digital filters and more particularly to adaptive IIR (infinite impulse response), or recursive, filters.

(2) Description of the Prior Art

Digital filters are used in a number of applications. In some applications, digital filters facilitate the extraction of data from an otherwise noisy input signal.

In other applications, to which the instant invention is primarily directed, the digital filter is used in connection with a reference system, which receives an input signal and generates an output signal in response thereto. In such applications, the digital filter is used to facilitate an the understanding of the operation of a reference system. Digital filters used in such applications are referred to as "adaptive filters", because they operate in response to filter parameters that can be modified by the filters themselves to conform the operation of the filter to the operation of the reference system.

FIG. 1 depicts a general block diagram illustrating a system including an adaptive digital filter. With reference to FIG. 1, the system includes the reference system module 10 and the adaptive filter system 11, both of which receive an input signal u(t) in parallel. In the following, "t" represents a continuous variable, such as time; however, adaptive filter systems similar to those described in the following may be used with non-continuous input data, such as time-sampled data, with extensions that will be apparent to those skilled in the art. The reference system module generates an output signal, identified as reference signal y(t). The adaptive filter system 11 includes a programmable filter module 12 and a parameter adjustment module 13. The programmable filter module 12 receives the input signal u(t) and generates in response thereto and in response to various filter parameters, an output filtered signal y'(t). The reference signal y(t) generated by the reference system module 10, and the filtered signal y'(t) generated by the programmable filter module 12, are both directed to an adder 13, which generates an error signal v(t) as the difference between the reference signal y(t) and the filtered signal y'(t), or $$v(t) = y(t) - y'(t) \quad (1)$$

which is directed to a parameter adjustment module 14. The parameter adjustment module 14 receives the error signal v(t), and also the filter parameters and generates in response parameter adjustment values that are coupled to the programmable filter module 12 to adjust the parameters of the module 12. The parameter adjustment module 14 generates the parameter adjustment values to minimize the value of the error signal v(t), that is, to provide that the filtered signal y'(t) generated by the programmable filter module 12 maintains a close relationship to the reference signal y(t) from the reference system module 10. To the extent that the parameter adjustment module 14 can adjust the filter parameters of the programmable filter module 12 to minimize the error signal v(t), the operation of the programmable filter module 12 will constitute a good model of the operation of the reference system module 12 in response to the input signal u(t).

There are two basic types of digital filter design methodologies, namely, non-recursive, or "finite impulse response" ("FIR"), filters, and recursive, or "infinite impulse response" ("IIR") filters. In an FIR filter, the output signal Y'FIR (t) is essentially a polynomial in the input signal u(t), or $$y'_{FIR}(t) = \sum_{i=0}^{n} c_i \, u(t)^i \quad (2)$$

where the coefficients c are the filter parameters. It will be appreciated that, for an FIR filter, the value of the output signal $y'_{FIR}$ (t) is linear in each of the coefficients $c_i$. On the other hand, in an IIR filter, the output signal $Y'_{IIR}$ (t) is a ratio of polynomials in the input signal u(t), or $$y'_{IIR}(t) = \frac{\sum_{j=0}^{n} a_j \, u(t)^j}{\sum_{k=0}^{m} b_k \, u(t)^k} \quad (3)$$

with coefficients $a_j$ and $b_k$ being the filter parameters. It will be apparent that the output signal $y'_{IIR}$ (t) will not be linear in the coefficients $a_j$ and $b_k$, in which case adjustment of the filter parameters in relation to the error signal v(t) can be a complex matter.

SUMMARY OF THE INVENTION

It is an object of the invention to provide a new and improved adaptive IIR digital filter system which facilitates a simplification of the adjustment of the filter parameters in relation to the value of the error signal measuring the difference between value of a reference signal from a reference system module and a filtered signal generated by the adaptive filter system.

In brief summary, the adaptive filter system operates in connection with a reference system that receives an input u(s) and generating in response thereto a reference output y(s) defined by a reference transfer function H(s)=c(sI−A)$^{-1}$b+d, where "I" is the identity matrix and matrix A, vectors b and c, and scalar d are reference parameters, and "s" is a variable for the input. The adaptive filter system comprises a system model module, a gradient filter module, an adjustable parameter module, and a parameter adjustment module. The system model module receives the input u(s) and generates in response thereto and in response to a plurality of model parameters matrix A', vectors b' and c', and scalar d, an intermediate model output vector x'(s)=u(s)I and a model output y'(s)=cx'(s). The gradient filter module receives the intermediate model output vector x'(s) and generates a gradient output vector w(s)=∫x'(s)+A'w(s)ds. The adjustable parameter module receives the gradient output vector w(s) from the gradient filter module, x'(s) from the system model module and input u(s) and generates dot products with respective adjustable parameters α, β and δ to generate a model adjustment value v'(t). The parameter adjustment module generates adjusted parameters for use by the adjustable parameter module in response to current values of adjustable parameters and an error value $e(s) = y(s) - [y'(s) + v'(s)]$.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 3A and 3B are block diagrams of adaptive IIR digital filter systems useful in understanding the operation of the adaptive digital filter depicted in FIG. 2.

DESCRIPTION OF THE PREFERRED EMBODIMENT

Figure 1:
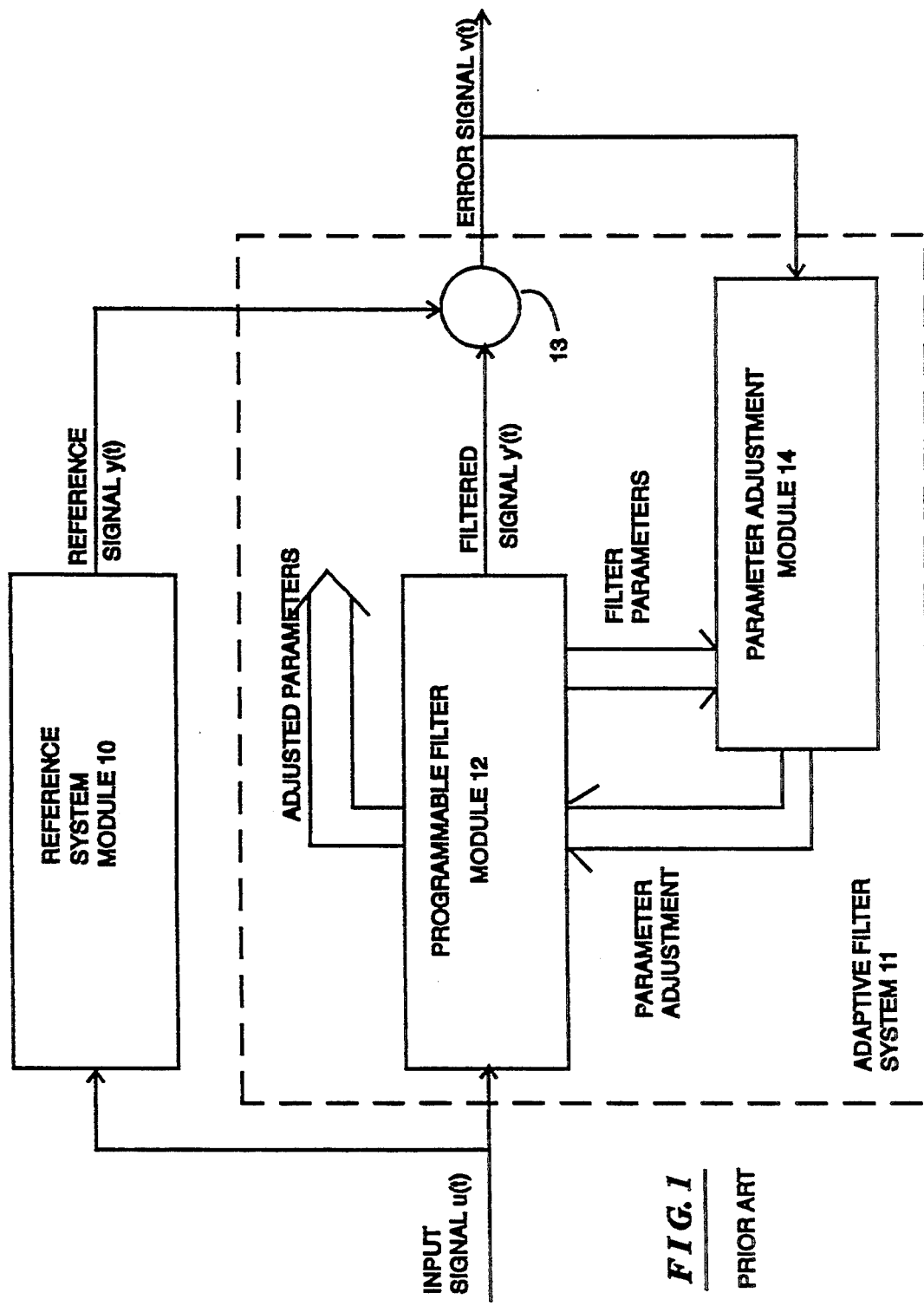
FIG. 1 is a block diagram of a system including a conventional adaptive digital filter system useful in understanding the background of the invention.
Figure 2:
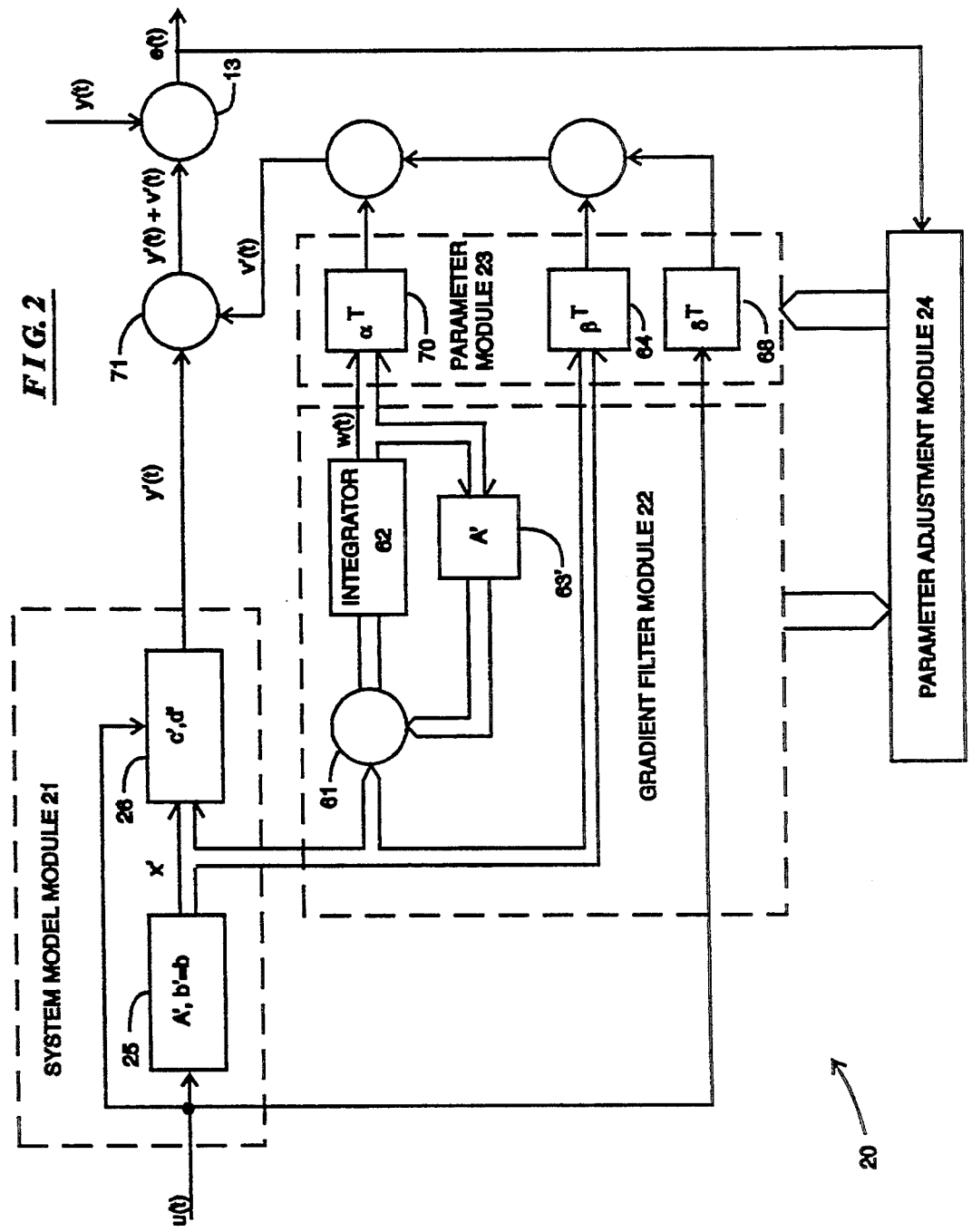
FIG. 2 is a block diagram of an adaptive IIR digital filter system constructed in accordance with the invention.

FIG. 2 is a block diagram of an adaptive IIR digital filter system 20 constructed in accordance with the invention. With reference to FIG. 2, the filter system 20 includes a system model module 21, a gradient filter module 22 and a parameter module 23, which generally perform the operations described above in connection with the programmable filter module 12 (FIG. 1) to generate a filtered output signal y'(t) in response to an input signal u(t). In the following, "t" represents a continuous variable such as time; however, a similar filter system may be used with non-continuous, or discrete sampled input data, to generate similar output data, will be described below. In addition, the filter system 20 includes a parameter adjustment module 24 that generally performs the operations described above in connection with the parameter adjustment module 14 (FIG. 1), in particular generating adjusted parameter values for the gradient filter module 22 and parameter module 23.

The adaptive filter system 20 operates to adapt a set of filter parameters in relation to an output signal y(t) generated by a reference system module (not shown in FIG. 2) corresponding to reference system module 10 depicted in FIG. 1. In the following, it will be assumed that the reference system module 10 represents a transfer function H(s):

$$H(s) = c(sI - A)^{-1}b + d \quad (4)$$

where "I" is the identity matrix, and matrix "A," vectors "b" and "c" and scalar "d" are operational parameters, and "s" is a dummy variable. Based on this assumption, the system model module 21 is constrained to have a transfer function H'(s):

$$H'(s) = c'(sI - A')^{-1}b' + d' \quad (5)$$

where "I" is the identity matrix, and matrix "A'," vectors "b'" and "c'" and scalar "d'" are operational parameters, with the value of vector b' corresponding to the value of vector b. The system model module 21 includes module 25 and 26 that perform the operation defined by the transfer function H'(s) in connection with input signal u(t) to generate the output signal y'(t). In particular, the module 25 generates, in response to the input signal u(t) an intermediate result vector x'(t) corresponding to:

$$y'(t) = cx'(t)b + d \quad (6)$$

The module 26 receives the input signal u(t) and the intermediate result vector x'(t) and generates in response the output signal y'(t) corresponding to:

$$x'(t) = u(t)I - A' \quad (7)$$

Figure 3A:
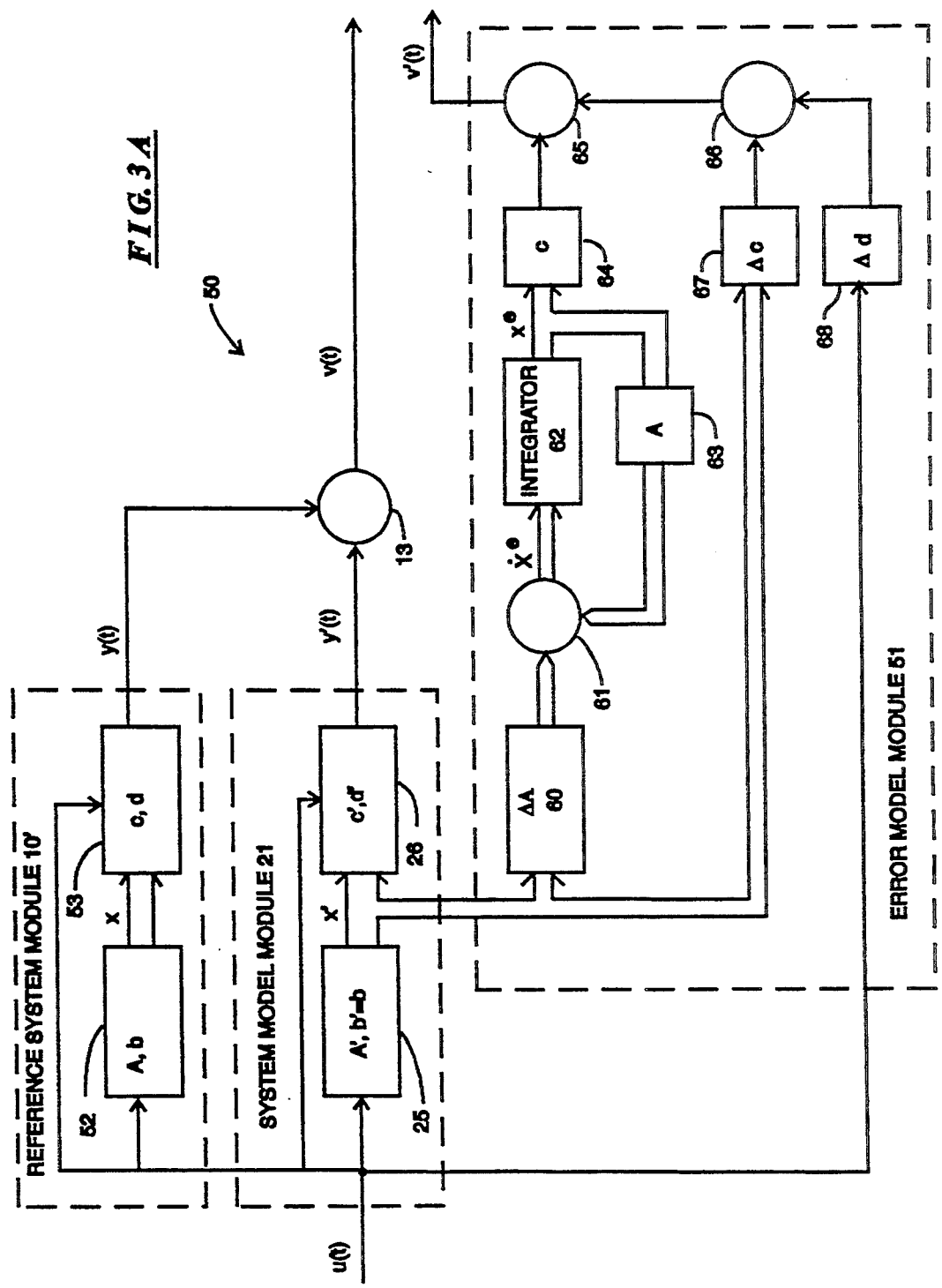

The operation of the gradient filter module 22 and the parameter module 23 will be described in connection with FIGS. 3A and 3B. With reference to FIG. 3A, that FIG. depicts the reference system module 10 shown in FIG. 1, the system model module 21 including modules 25 and 26, and an error model module 51. The reference system module 10 is shown as including modules 52 and 53, which perform operations in connection with transfer function H(s) (equation 4) corresponding to those described above in connection with modules 25 and 26 (equations 5 through 7). The adder 13, as in the embodiment depicted in FIG. 1, receives the reference output signals y(t) from the reference system module 10 and the output signal y'(t) from the system model module 21 and generates the error signal v(t) as described above in connection with FIG. 1.

The state and output signal values for the reference system module 10 (FIG. 3A) are:

$$\dot{x}(t) = Ax(t) + bu(t) \quad (8)$$

$$y(t) = cx(t) + du(t) \quad (9)$$

where $\dot{x}(t)$ is the first derivative of x(t) with respect to "t." Similarly, the state and output signal values for the system model module 21 are:

$$\dot{x}'(t) = A'x'(t) + bu(t) \quad (10)$$

$$y'(t) = cx'(t) + du(t) \quad (11)$$

where $\dot{x}'(t)$ is the first derivative of x(t) with respect to "t." The error between the states of the reference and model systems modules is defined as $x^e(t) = x(t) - x'(t)$, in which case $\dot{x}^e(t) = \dot{x}(t) - \dot{x}'(t)$, where $\dot{x}^e(t)$ is the first derivative of $x^e(t)$ with respect to "t." From equations 8 and 10, $$\begin{aligned} \dot{x}^e(t) &= Ax(t) - A'x'(t) \\ &= Ax(t) - Ax'(t) + Ax'(t) - A'x'(t) \\ &= Ax^e(t) + \Delta Ax'(t) \end{aligned} \quad (12)$$

where $\Delta A = A - A'$. Similarly, the error signal v (t) generated by adder 13 representing the difference between the reference output signal y(t) and the output signal y'(t) from the system model module 21 corresponds to:

$$\begin{aligned} v(t) &= y(t) - y'(t) \\ &= cx(t) + du(t) - c'x'(t) - d'u(t) \\ &= cx(t) - cx'(t) + cx'(t) - cx'(t) - \Delta du(t) \\ &= cx^e(t) - [\Delta cx'(t) + \Delta du(t)] \end{aligned} \quad (13)$$

where $\Delta c = c - c'$ and $\Delta d = d - d'$. Equations 12 and 13 are embodied directly by the error model module 51. In particular, a multiplier 60, an adder 61, an integrator module 62, and a multiplier 63 generate $x^e(t)$ in accordance with equation 12. In particular, multiplier 60 receives the intermediate result vector x'(t) from module 25 of the system model module 21 and generates the product $\Delta A x'(t)$, which it provides to one input of the adder 61. The adder 61 also receives the output of multiplier 63 to generate the value $\dot{x}^e(t)$, which the integrator module 62 receives and integrates to generate the $x^e(t)$ output. Multiplier 63 receives $x^e(t)$ from the integrator module 62 and generates an output corresponding to the value $Ax^e(t)$ which is coupled to the second input of adder 61, enabling the adder 61 to generate the value $\dot{x}^e(t) = Ax^e(t) + \Delta A x(t)$, as required in equation 12 above.

The output $x^e(t)$ of the integrator 62 is coupled to a multiplier 64, which multiplies the output $x^e(t)$ by the value of parameter "c" to generate the value $cx^e(t)$, which is the first addend for the value of error signal v(t) in equation 13. (The multiplier 64 performs the dot product between the vector comprising parameter "c" and the vector comprising output $x^e(t)$ from the integrator 62.) The output of multiplier 64 is coupled to one input of an adder 65. The second input of adder 65 is provided by a second adder 66, which receives inputs from multipliers 67 and 68. The multiplier 67 receives the intermediate result vector x'(t) from the system model module 21 and generates an output $\Delta c x'(t)$, where, as above, $\Delta c = c - c'$. (As with multiplier 64, multiplier 67 essentially generates the dot product of vector $\Delta c$ and the intermediate result vector x'(t).) Multiplier 68 receives the input signal u(t) and generates an output $\Delta d u(t)$, where, as above, $\Delta d = d - d'$. Adder 66 generates the sum of the outputs from the multipliers 67 and 68, that is, $\Delta c x'(t) + \Delta d u(t)$, which it couples to the second input of adder 65. The adder 65 subtracts the value provided by the adder 66 at its second input from the value provided by multiplier 64, that is, $cx^e(t) - [\Delta c x'(t) + \Delta d u(t)]$. Accordingly, the output of the adder 65, identified in FIG. 3A as v'(t), corresponds exactly to the error signal v(t) generated by adder 13.

In situations in which the matrix A commutes with the matrix A', that is, if $A'A = AA'$, then $\Delta A$ commutes with both matrix A and matrix A'. When this occurs, the multiplier 60 in FIG. 3A can be combined with multiplier 64, as is depicted in FIG. 3B, to form a modified multiplier 70. With reference to FIG. 3B, the adder 61 in the error model module 51 receives the intermediate result vector x'(t) from the system model module 21 directly. The integrator module 62 generates an output identified as w(t). Modified multiplier module 70 receives the w(t) output from the integrator module 62 and multiplies it by a value corresponding to $c\Delta A$, which is denoted in FIG. 3B as $\Delta a$. In the embodiment depicted in FIG. 3B, the output signal y'(t) from the system model module 21 is directed to one input of an adder 70. The output v'(t) of the adder 65 in the error model module 50 is directed to the second input of adder 70, and the adder 70 generates an output corresponding to y'(t) + v'(t), which is coupled to an input of adder 13. The second input of adder 13 receives the output signal y(t) from the reference system module 10. Adder 13 generates an output e(t) corresponding to $$e(t) = y(t) - [y'(t) + v'(t)] \quad (14)$$
$$= y(t) - y'(t) - v'(t)$$
$$= v(t) - v'(t)$$
$$= 0$$

if v(t) = v'(t).

Returning to FIG. 2, it will be appreciated that the gradient filter module 22 essentially comprises the adder 61, integrator 62 and multiplier 63 of the error model module 51 (FIG. 3B), and the parameter module 23 comprises the multipliers 70, 67 and 68 of the error model module 51 (FIG. 3B). The parameters A', b', c', and d' used by the system model module 21 are fixed at nominal values based on a priori knowledge about the reference system module 10. The matrix A used in the multiplier 63 is not known a priori and so it is replaced by matrix A' used in implementing the system model module 21. The parameters $\Delta a$, $\Delta c$ and $\Delta d$ used in connection with the multipliers 70, 67 and 68 of FIG. 3B are also not known a priori and are the parameters in the filter system 20 depicted in FIG. 2 that are adjusted by the parameter adjustment module 24. In FIG. 2, these adjustable parameters are identified by "$\alpha$" (for multiplier 70), "$\beta$" (for multiplier 67) and "$\delta$" (for multiplier 68), to indicate their adjustable nature. (In each multiplier 67, 68 and 70, superscript "T" has been added to each adjustable parameter, indicating that the respective multiplier essentially generates a result comprising the dot product between the input and the respective adjustable parameter.) It will be appreciated, if the matrix A' is an "n-by-n" matrix, such that the output vector x' has dimension 1-by-n, then each of the parameters $\alpha$ and $\beta$ comprise 1-by-n vectors and parameter $\delta$ is a scalar (which corresponds to a 1-by-1 vector).

Two observations will be helpful at this point. First, the error e(t) between the reference system output y(t) and the output of the adaptive filter system 20, y'(t) + v'(t), provided by adder 70, is a linear function of the adjustable parameters $\alpha$, $\beta$ and $\delta$, so that the surface of the mean squared error function (described below in connection with the parameter adjustment module 24) is a quadratic function of these parameters. Since the mean squared error function is quadratic, it has a minimum point, which, if multiplier 63'(FIG. 2) used the matrix A, as in the multiplier 63 (FIG. 3B), instead of matrix A' does not have the value zero. This follows from the facts that, as noted above, (i) in the embodiment depicted in FIG. 3B, the error e(t) between the output signal y(t) from the reference system module 10 (shown in FIG. 3A) and the output signal y'(t) + v'(t) from the adaptive filter system is exactly zero since, in part, the multiplier 63 uses matrix A in connection with the multiplication performed thereby, whereas, (ii) in the embodiment depicted in FIG. 2, since, in part, the multiplier 63' uses matrix A' in connection with the multiplication performed thereby, the error signal e(t) between the output signal y(t) from the reference system module 10 (shown in FIG. 3A) and the output signal y'(t) + v'(t) from the adaptive filter system 20 need not be exactly zero.

As noted above, in sequencing from the design in FIG. 3A to the design FIG. 3B, the multiplier 60 is combined with multiplier 64 to create multiplier 70, which is possible if the matrices A and A' commute. If the matrices A and A' do not commute, so that $AA' \neq A'A$, in many circumstances it is possible to construct matrix transformations which do commute, which can be used instead of A and A'. That is, if matrices A and A' do not commute, but if each is nonsingular with simple real eigenvalues, then an orthogonal transformation T', a matrix of the same dimensionality as matrices A and A', can be generated in a conventional manner to provide a diagonal matrix $\Lambda' = T'A'T'^T$ (where matrix $T'^T$ is the transpose of matrix T'). Similarly, the matrix A can be factored to generate a diagonal matrix Λ defined by $A=T'^T \Lambda T'$, where matrix Λ is a diagonal matrix whose elements comprise the eigenvalues of matrix A. These correspondences are valid since the transformation matrix T' does not change the assumed eigenvalues of the matrix A, so, with the other parameters fixed or adjustable to generate the required response, the transfer function H(s) of the reference system module 10 will be unchanged. With this assumption, transformation matrix T' can be used along with matrix A to provide the diagonal matrix Λ as $\Lambda=T'AT'^T$. Similarly, the transformation T' can be used in connection with matrix ΔA to generate a matrix $\Delta\Lambda = T'\Delta A T'^T$. If the transformation matrix T' is applied to both the reference system module 10 (FIG. 3A) and the adaptive filter system 20 (FIG. 2), then both the matrix ΔA and matrix A' of the gradient filter module 22 can be substituted by the transformed matrices ΔΛ and Λ', which are diagonal and thus commute. Accordingly, the transformed matrix ΔΛ, substituted for matrix ΔA in connection with multiplier 60 (FIG. 3A), can be combined with multiplier 64 to create multiplier 70 of the adaptive filter system 20.

As noted above, the parameter adjustment module 24 adjusts the values of the parameters α, β, and δ in response to the current values of the parameters and the value of the error e(t). In one particular embodiment, the parameter adjustment module 24 performs a least mean square operation in connection with the each of the components of the vector parameters α and β and the scalar parameter δ, and the error e(t) to adjust the parameter values. If γ represents a consolidated vector comprising the concatenation of vectors α and β and the scalar δ, that is, $\gamma = <\alpha \mid \beta \mid \beta>$, where " | " is the concatenation operator and "g(t)" is a vector representing the concatenation of the components of inputs w(t), x'(t) and u(t) to multipliers 70, 67 and 65, respectively, that is $g(t) = <w(t) \mid x'(t) \mid u(t)>$, the least mean square adjustment Δγ is defined by $$\Delta\gamma = -\Gamma g(t)e(t) \tag{15}$$

where "Γ" is a gain matrix which determines the properties with which parameter adjustment module 24 adjusts the adjustable parameters α, β, and δ to converge to the proper values to minimize the error e(t). The vector g(t) is effectively a vector of gradient signals, that is, the gradient of the error with respect to the adjustable parameters; thus module 22 (FIG. 2) is termed a "gradient filter module".

The gain matrix Γ may be selected to have the form $\Gamma = \rho_0 I$, where "I" is the identity matrix and "$\rho_0$" is a scalar. If a gain matrix of this form is selected, the least mean square adjustment will have a relatively steep convergence, that is, the parameter adjustment module 24 will adjust the adjustable parameters α, β and δ to the appropriate values relatively quickly. On the other hand, the gain matrix Γ may have other forms which will be apparent to those skilled in the art. It will be apparent to those skilled in the art that the methodology used by the parameter adjustment module 24 to adjust the adjustable parameters α, β and δ has a computational complexity of order "N", where "N" is the order of the reference system. In prior adjustable filter systems, such as those described above in connection with FIG. 1, parameter adjustment has a computation complexity of higher order, which complicates the adjustment of their respective adjustable parameters. Indeed, as noted above in connection with equation 2, adjustment of the parameters of prior IIR filters is a ratio of two polynomials, in which case adjustment of the filter parameters is a complicated operation. However, the adaptive filter system 20, which is also an IIR filter, provides an arrangement in which adjustment of the filter parameters is linear which can easily be accomplished using least-mean squared methodology.

In the above, it has been assumed that the input signal u(t) for adaptive filter system 20 was a function of a continuous variable "t". It will be appreciated, however, that the adaptive filter system 20 may also be used with non-continuous or discrete sampled data. In that case, the discrete adaptive filter system has a structure similar to that described above in connection with FIG. 2, and the parameter adjustment module 24 operates to update the adjustable parameters α, β, and δ in a similar manner, with the following extensions. In particular, the state and output signal values for a discrete reference system module (compare equations 8 and 9 above) are:

$$x(k+1) = Ax(k) + bu(k) \tag{16}$$

$$y(k) = cx(k) + du(k) \tag{17}$$

where "k" is the index for data in the discrete data stream input to the discrete reference model module, and "A", "b", "c" and "d" have the same meanings as for the continuous data reference model module described above. Similarly, the state and output signal values for the discrete system model module (compare equations 10 and 11 above) are:

$$x'(k+1) = A'x'(k) + bu(k) \tag{18}$$

$$y'(k) = c'x'(k) + d'u(k) \tag{19}$$

Similarly, the discrete-valued analogs of equations 12 and 13 are:

$$x^e(k+1) = Ax^e(k) + \Delta A x'(k) \tag{20}$$

$$v(k) = cx^e(k) - \Delta c x'(k) - \Delta d u(k) \tag{21}$$

These equations 20 and 21 are implemented by a discrete adaptive filter system having the structure set forth in FIG. 3A in the same way as described above in connection with the continuous adaptive filter system described above in connection with equations 12 and 13. The transition for the discrete adaptive filter system, from the embodiment depicted in FIG. 3A to the embodiments depicted in FIGS. 3B and 2 is achieved in the same way as that for the continuous adaptive filter system. Similar to the continuous adaptive filter system, the parameter adjustment module for the discrete adaptive filter system (corresponding to module 24 in FIG. 2) adjusts the adjustable parameters using a least mean square methodology defined by (compare equation 15 above):

$$\gamma(k+1) = \gamma(k) + \Gamma g(k)e(k) \tag{22}$$

where "γ", g(k), and e(k) comprise discrete-data analogs to the continuous-data functions described above in connection with equation 15, and "Γ", as above, is a gain matrix whose value determines the convergence properties of the parameter adjustment module.

It will be appreciated that the adaptive filter system 20 as described in connection with FIG. 2 may be implemented using specially designed hardware or a suitably programmed digital computer the programming for which is readily apparent to one skilled in the art using the description set forth herein.

The preceding description has been limited to a specific embodiment of this invention. It will be apparent, however, that variations and modifications may be made to the invention, with the attainment of some or all of the advantages of the invention.

Therefore, it is the object of the appended claims to cover all such variations and modifications as come within the true spirit and scope of the invention.

What is claimed is:

1. An adaptive filter system for use in connection with a reference system, the reference system receiving an input u(s) and generating in response thereto a reference output y(s) defined by a reference transfer function $H(s)=c(sI-A)^{-1}b+d$, where "I" is the identity matrix and matrix A, vectors b and c, and scalar d are reference parameters, and "s" is a variable for the input, the adaptive filter system comprising:

a system model module for receiving the input and generating in response thereto and in response to a plurality of model parameters matrix A', vectors b' and c', and scalar d, an intermediate model output vector $x'(s)=u(s)I-A'$ and a model output $y'(s)=cx'(s)b+d$;

a gradient filter module for receiving the intermediate model output vector x' (s) and generating a gradient output vector $w(s)=\int x'(s)+A'w(s)ds$;

an adjustable parameter module for receiving the gradient output vector w(s) from the gradient filter module, x'(s) from the system model module and input u(s) and generating dot products with respective adjustable parameters $\alpha$, $\beta$ and $\delta$ to generate a model adjustment value v'(s); and a parameter adjustment module for generating adjusted parameters for use by the adjustable parameter module in response to current values of adjustable parameters and an error value $e(s)=y(s)-[y'(s)+v'(s)]$.

2. An adaptive filter system as defined in claim 1 in which the gradient filter module comprises:

an adder module having a first input for receiving said intermediate model output vector x'(s), a second input, and an output for generating a vector representing the sum of the intermediate model output vector x'(s) and a vector coupled to the second input;

an integrator module for generating in response to the output of the adder module the gradient output vector w(s); and a multiplier for receiving the gradient output vector w(s) and generating in response thereto and in response to the parameter matrix A' an output vector which is coupled to the second input of said adder module.

3. An adaptive filter system as defined in claim 1 in which said parameter adjustment module generates said adjusted parameters in accordance with a least mean squared methodology.

4. An adaptive filter system as defined in claim 3 in which said parameter adjustment module generates the adjusted parameters in accordance with a least mean square adjustment value $\Delta\gamma$, where $$\Delta\gamma = -\Gamma g(s)e(s)$$

where vector $\gamma$ represents the concatenation of the adjustable parameters into a single vector, g(s) represents the concatenation of the gradient output vector w(s), the intermediate model output vector x'(s) and the input u(s) into a single vector, and $\Gamma$ represents a selected gain matrix.

5. An adaptive filter system as defined in claim 4 in which the gain matrix $\Gamma$ is selected to be $\Gamma=\rho_0 I$, where "I" is the identity matrix and $\rho_0$ is a selected scalar.

6. A method for operating an adaptive filter system, said adaptive filter system being for use in connection with a reference system, the reference system receiving an input u(s) and generating in response thereto a reference output y(s) defined by a reference transfer function $H(s)=c(sI-A)^{-1}b+d$, where "I" is the identity matrix and matrix A, vectors b and c, and scalar d are reference parameters, and "s" is a variable for the input, the method comprising the steps of:

receiving the input u(s) and generating in response thereto and in response to a plurality of model parameters matrix A', vectors b' and c', and scalar d, an intermediate model output vector $x'(s)=u(s)I-A'$ and a model output $y'(s)=cx'(s)b+d$;

receiving the intermediate model output vector x'(s) and generating a gradient output vector $w(s)=\int x'(s)+A'w(s)ds$;

receiving the gradient output vector w(s) from the gradient filter module, x'(s) and the input u(s) and generating dot products with respective adjustable parameters $\alpha$, $\beta$ and $\delta$ to generate a model adjustment value v'(t); and generating adjusted parameters for use by the adjustable parameter module in response to current values of adjustable parameters and an error value $e(s)=y(s)-[y'(s)+v'(s)]$.

* * * * *